United States Patent [19]

Akitake et al.

[11] 4,349,696

[45] Sep. 14, 1982

[54] AM STEREOPHONIC DEMODULATOR CIRCUIT FOR AMPLITUDE/ANGLE MODULATION SYSTEM

[75] Inventors: Isao Akitake; Tsutomu Noda, both of Yokohama; Kazuhiko Yamazaki, Iwaki, all of Japan

[73] Assignee: Hitachi, Ltd., Tokyo, Japan

[21] Appl. No.: 117,457

[22] Filed: Feb. 1, 1980

[30] Foreign Application Priority Data

| | | | |
|---|---|---|---|
| Feb. 5, 1979 | [JP] | Japan | 54-11459 |
| Aug. 22, 1979 | [JP] | Japan | 54-106082 |
| Aug. 22, 1979 | [JP] | Japan | 54-106084 |

[51] Int. Cl.[3] .......................... H04H 5/00; H03D 3/00

[52] U.S. Cl. .......................... 179/1 GS; 329/135; 329/167

[58] Field of Search .............. 179/1 GS, 1 GJ, 1 GD; 329/50, 135, 147, 167

[56] References Cited

U.S. PATENT DOCUMENTS

| | | | |
|---|---|---|---|
| 3,061,683 | 10/1962 | Freedman et al. | 179/1 GS |
| 3,128,345 | 4/1964 | Freedman et al. | 179/1 GS |
| 3,167,614 | 1/1965 | Holt et al. | 179/1 GS |
| 3,178,514 | 4/1965 | Holt | 179/1 GS |
| 4,122,394 | 10/1978 | Fukushima et al. | 329/103 |

*Primary Examiner*—Douglas W. Olms

*Attorney, Agent, or Firm*—Craig and Antonelli

[57] ABSTRACT

An AM stereophonic demodulator circuit for an amplitude/angle modulation system, comprising an AM detector circuit for producing a stereophonic sum signal (L+R), an FM or PM detector circuit for producing a stereophonic difference signal (L−R), and control means for extracting a DC voltage proportional to an antenna input level from the AM detector circuit so as to use the DC voltage to control the gain and amplitude of an FM or PM detector stage including the FM or PM detector circuit.

6 Claims, 22 Drawing Figures

AM STEREOPHONIC DEMODULATOR CIRCUIT FOR AMPLITUDE/ANGLE MODULATION SYSTEM

BACKGROUND OF THE INVENTION

1. Field of the Invention

This invention relates to an improvement of an AM stereophonic domodulator circuit for an amplitude/angle modulated signal which is obtained by angle-modulating a carrier wave by a stereophonic difference signal and then amplitude-modulating the angle-modulated carrier by a stereophonic sum signal.

2. Description of the Prior Art

There are two types of amplitude/angle modulation, i.e. AM/FM and AM/PM, as described in U.S. Pat. No. 3,167,614 (issued to Francis R. Holt and Jack Avins on Jan. 26, 1965). In the AM/FM type, a carrier wave frequency-modulated by a stereophonic difference signal (L−R) is amplitude modulated by a stereophonic sum signal (L+R). In the AM/PM type, a carrier wave phase modulated by a stereophonic difference signal (L−R) is amplitude modulated by a stereophonic sum signal (L+R).

When the AM/FM or AM/PM type is employed, the antenna input level/output level characteristic of the AM detected signal is different from that of the FM or PM detected signal in the stereophonic demodulator circuit, and thus the AM detected output signal (L+R) and the FM or PM detected output signal (L−R) have different amplitude levels. This involves the problem that when the left channel signal (called L signal hereinafter) and the right channel signal (called R signal hereinafter) are extracted or separated from the respective detected stereophonic signals (L+R) and (L−R) in an audio matrix circuit, the degree of separation of the L and R signals is degraded with relatively low and relatively high level antenna inputs.

SUMMARY OF THE INVENTION

It is an object of the invention to provide a stereophonic demodulator circuit presenting a good separation of the L and R signals in a range from high to low signal level inputs.

According to the present invention, the above object can be achieved by providing gain control means which detects the level of an input signal induced in an AM stereophonic receiver circuit, produces a control signal proportional to the input signal level from the detected signal, and controls the gain of an FM or PM detector stage for producing a stereophonic difference signal (L−R) in response to the input signal level so that the stereophonic sum and difference signals (L+R) and (L−R) may be controlled to have the same amplitude for any antenna input signal level.

DESCRIPTION OF THE PREFERRED EMBODIMENTS

Figure 1:
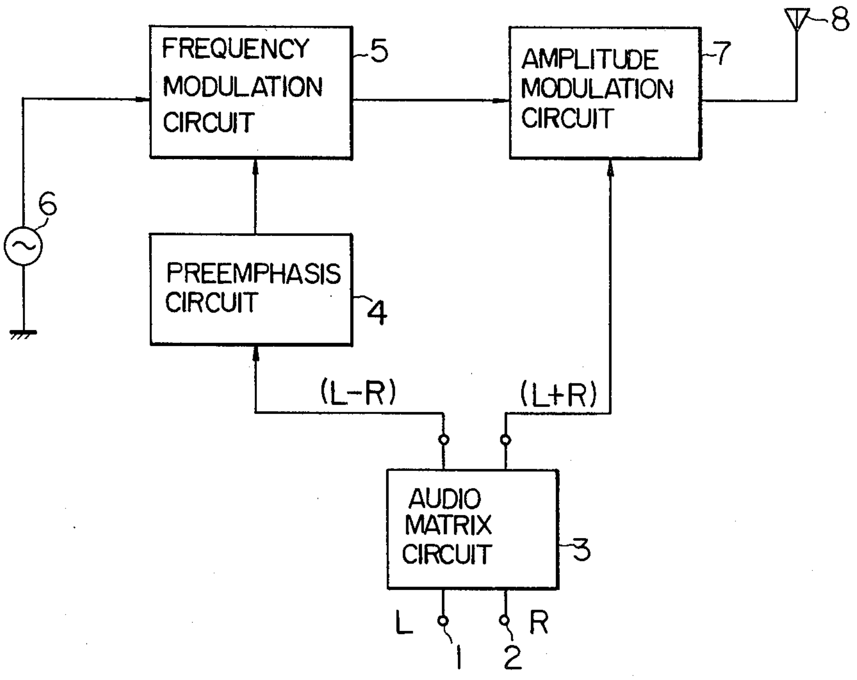
FIG.1 (PRIOR ART)
FIGS. 1 and 2 are block diagrams of transmitting and receiving systems of AM/FM type, respectively, which are of one of the AM stereophonic types.
Figure 2:
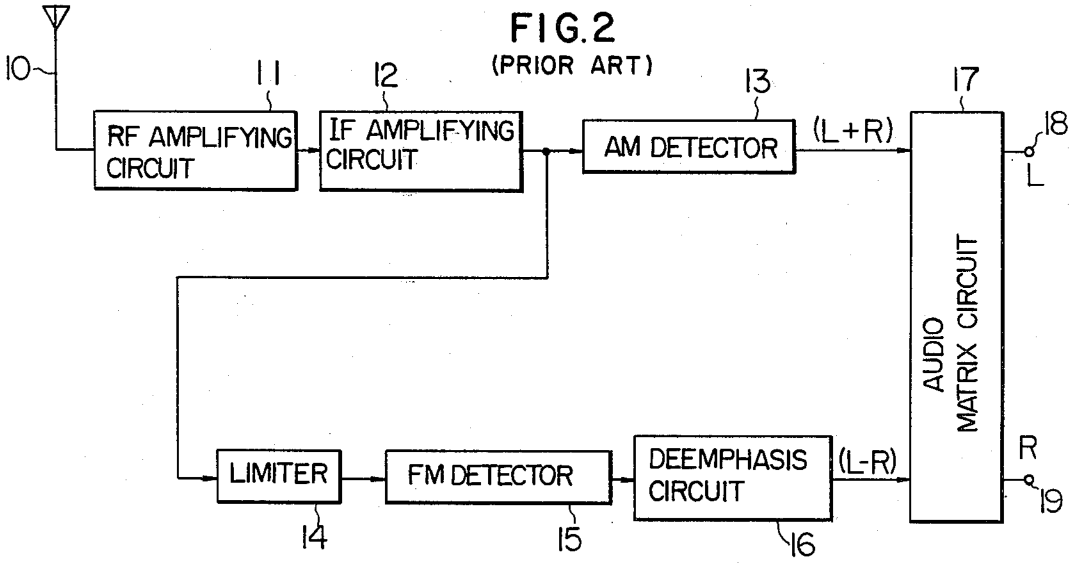
FIG.2 (PRIOR ART)

For better understanding of the principle of the present invention, the prior art will first be described with reference to block diagrams of an AM/FM system shown in FIGS. 1 and 2. FIG. 1 is a fundamental transmission block diagram for the AM/FM system, and FIG. 2 is a demodulation block diagram associated with FIG. 1. In FIG. 1, the reference numeral 1 designates an L signal input terminal; 2 designates an R signal input terminal; 3 designates an audio matrix circuit for linearly subtracting the R signal from the L signal and for linearly summing the L and R signals so as to produce a stereophonic difference signal (L−R) and a stereophonic sum signal (L+R); 4 designates a preemphasis circuit for preemphasizing the stereophonic difference signal; 5 designates a frequency modulation circuit for frequency-modulating a carrier signal from a carrier generator 6 by the stereophonic difference signal (L−R) received through the preemphasis circuit 4; 7 designates an amplitude modulation circuit for receiving the stereophonic sum signal from the matrix circuit 3 and the frequency modulated signal from the frequency modulation circuit 5 and then amplitude-modulating the frequency modulated carrier signal by the stereophonic sum signal (L+R); and 8 designates a transmission antenna.

A demodulator system will now be described. In FIG. 2, reference numeral 10 designates a receiving antenna; 11 designates an RF amplifying circuit including a frequency converter; 12 designates an IF amplifying circuit; 13 designates an AM detector circuit; 14 designates a limiter circuit; 15 designates an FM detector circuit; 16 designates a deemphasis circuit; 17 designates an audio matrix circuit; and 18 and 19 designate output terminals.

Figure 3:
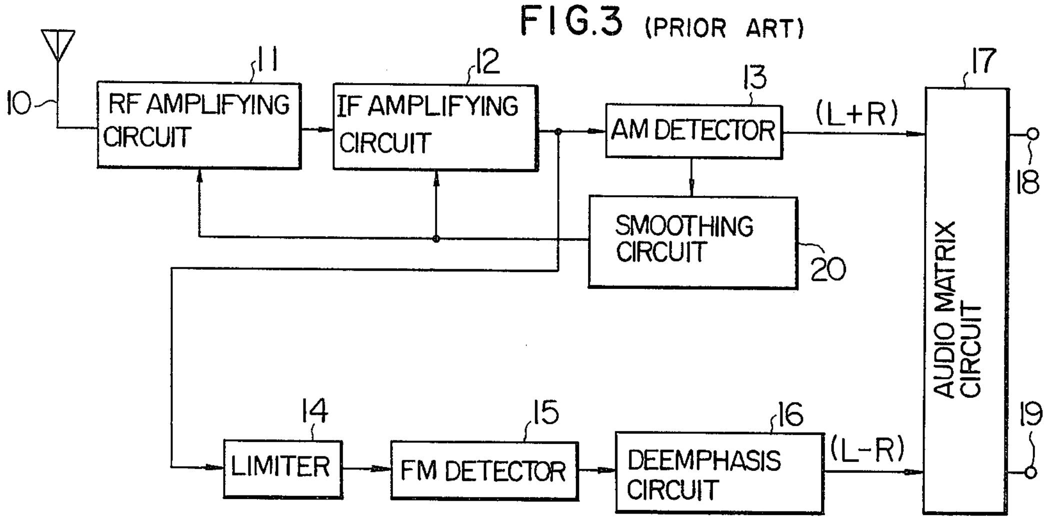
FIG.3 (PRIOR ART)
FIG. 3 is a block diagram of a conventional AM/FM type receiver circuit.

In this arrangement, when the stereophonic signal transmitted from the transmission system shown in FIG. 1 is induced on the antenna 10, the stereophonic signal is amplified by the RF amplifying circuit 11 to become an IF stereophonic signal. The IF stereophonic signal is supplied through the IF amplifying circuit 12 to the AM detector circuit 13 and the limiter circuit 14. The AM detector circuit 13 demodulates the stereophonic signal in a well-known manner to extract the stereophonic sum signal (L+R) which is supplied to the following matrix circuit 17. On the other hand, the limiter circuit 14 eliminates the AM signal component of the stereophonic sum signal (L+R) in the stereophonic signal and passes the FM signal, which is modulated by the stereophonic difference signal, to the following FM detector circuit 15. The FM detector circuit 15 demodulates the FM signal in a well-known manner to extract the stereophonic difference signal (L−R). The stereophonic difference signal (L−R) is supplied to the matrix circuit 17 through the deemphasis circuit 16. The matrix circuit demodulates the stereophonic sum and difference signals (L+R) and (L−R) in a well-known manner to extract the L and R signals. Since the foregoing operation of demodulation is generally well-known, further explanation is omitted herein. For AM detection, i.e. detection of the (L+R) signal, such a demodulation system as described above generally employs an automatic gain control circuit (AGC circuit) including a smoothing circuit 20 shown in FIG. 3. That is, the automatic gain control circuit controls the gains of the high-frequency amplifier 11 and the IF amplifier 12 by using a DC signal from the smoothing circuit 20 which receives the DC component of the detected signal from the AM detector circuit 13. The input/output characteristics of the AM detection in this arrangement is represented by the curve 41 in FIG. 4. As indicated by the curve 41, the output level increases linearly with the input level in a range of relatively low input levels, but above a particular value of the input level, the AGC operates to substantially saturate the output level. It should be noted that the saturated level is not completely constant and increases gradually with the input level.

Figure 4:
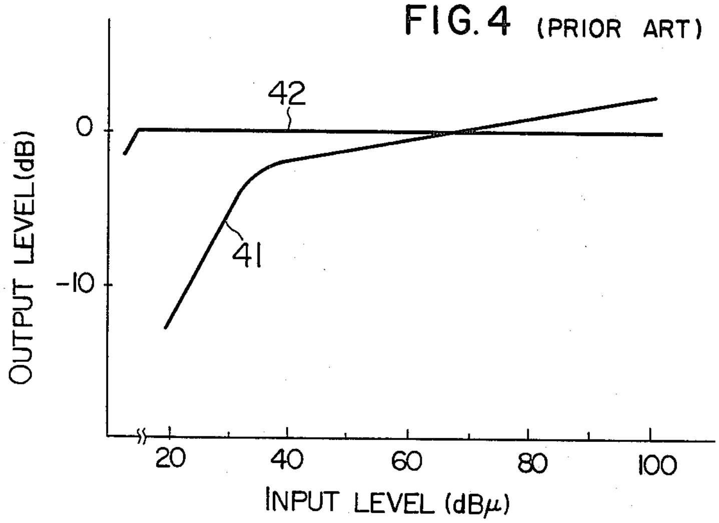
FIG.4 (PRIOR ART)
FIG. 4 is a typical input/output characteristics representation of AM and FM detection.

On the other hand, the curve 42 in FIG. 4 represents the input/output characteristic for the FM detection in which the limiter circuit 14 is set for a sufficiently large gain to eliminate the AM component so that the output level is maintained constant above a relatively low input level.

The input/output characteristics of the AM detection and FM detection are different from each other as described above, and this causes a difference between the amplitude levels of the detected stereophonic sum and difference signals (L+R) and (L−R), resulting in the previously described problem.

Similarly, the demodulation circuit for the AM/PM system also suffers from this problem.

Figure 5:
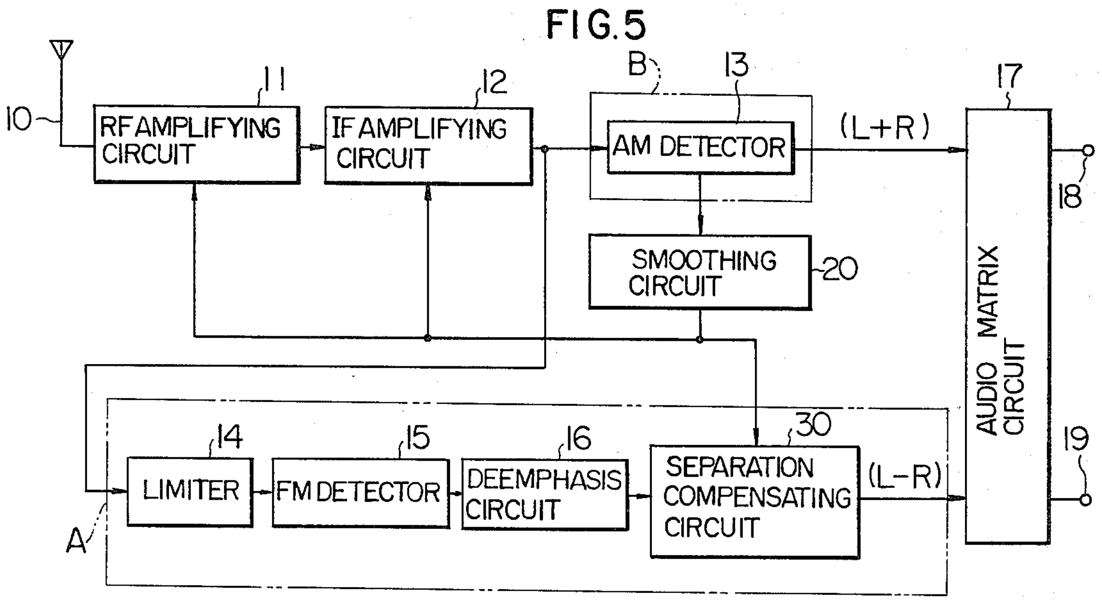
FIG. 5 is a block diagram of a fundamental embodiment of the present invention in which the AM/FM system is employed.

FIG. 5 is a block diagram of a demodulator circuit for AM/FM system according to one embodiment of the present invention, which is capable of eliminating the above-described problem. In FIG. 5, like members are designated by like reference numbers as in FIG. 2, so no further explanation is added herein. It should be noted that the reference numeral 30 designates a separation compensating circuit connected between the deemphasis circuit 16 and the matrix circuit 17 and also connected to the smoothing circuit 20 forming an AGC circuit.

In the arrangement shown in FIG. 5, the smoothing circuit 20 connected to the AM detector circuit 13 provides a DC voltage depending on the level of an antenna input signal. The DC voltage is fed back to the RF amplifying circuit 11 and the IF amplifying circuit 12 as AGC voltages to make the output substantially constant when the input signal is above a certain level. The DC voltage is also used as a control voltage to control the gain of the separation compensating circuit 30 which amplifies the stereophonic difference signal (L−R) obtained through FM detection.

Since the control voltages are proportional to the stereophonic sum signal (L+R) such as represented by the curve 41 in FIG. 4, the control voltages can be used to control the level of the stereophonic difference signal (L−R) represented by the curve 42 in such a manner that the stereophonic sum and difference signals (L+R) and (L−R) have the same amplitude for any antenna input level. This may allow the degree of separation of the R and L signals to be maintained constant independent of the antenna input level.

This operation will be described in detail hereinafter with reference to FIGS. 6 and 7.

Figure 6:
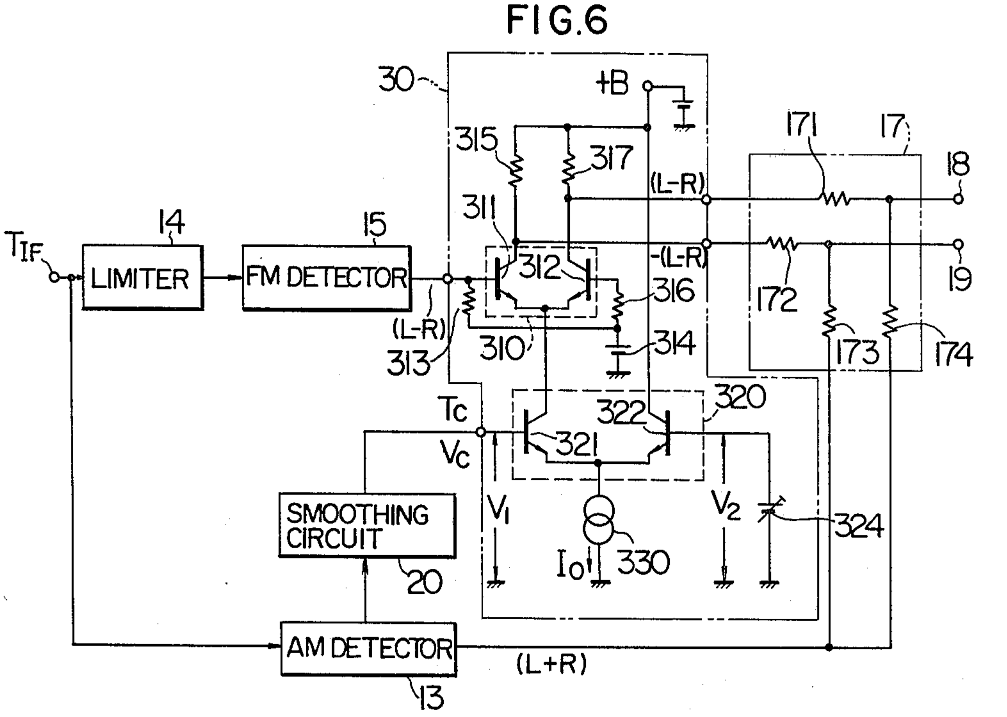
FIG. 6 is a specific circuit forming in part the system shown in FIG. 5.

FIG. 6 shows a particular circuit diagram of the above-described separation compensating circuit 30. In FIG. 6, reference numerals 310 and 320 designate differential amplifiers and reference numeral 330 designates a constant or regulated current source. The differential amplifier 310 comprises a differential pair of transistors 311 and 312. The base of the transistor 311 is connected to the FM detector circuit 15 and also connected through a resistor 313 to an operating voltage source 314. The collector of the transistor 311 is connected through a load resistor 315 to a power source +B. The base of the transistor 312 is connected through a resistor 316 to the operating voltage source 314, and the collector of the transistor 312 is connected through a load resistor 317 to the power source +B. The emitters of the transistors 311 and 312 are connected to each other. The differential amplifier 320 comprises a differential pair of transistors 321 and 322. The base of the transistor 321 is connected to an output terminal (control terminal) $T_c$ of the smoothing circuit 20, and the collector of the transistor 321 is connected to the commonly connected emitters of the differential pair of transistors 311 and 312 of the differential amplifier 310. The base of the transistor 322 is connected to a variable operating voltage source 324, and the collector of the transistor 322 is connected to the power source +B. The emitters of the transistors 321 and 322 are commonly connected and grounded through the regulated current source 330.

In the circuit arrangement shown in FIG. 6, the IF stereophonic signal fed to an input terminal $T_{IF}$ is detected to produce the stereophonic difference signal (L−R) by the FM detector circuit 15 and is simultaneously detected to produce the stereophonic sum signal (L+R) by the AM detector circuit 13. The stereophonic difference signal (L−R) from the FM detector circuit 15 is supplied to the differential amplifier 310 and amplified by the differential pair of transistors 311 and 312 in the amplifier 310. The differential pair of transistors 311 and 312 provide stereophonic difference signals (L−R) and −(L−R), respectively, which are supplied to the matrix circuit 17 in which these stereophonic difference signals are added to and subtracted from the stereophonic sum signal (L+R) obtained from the AM detector circuit 13. In this manner, the matrix circuit 17 provides L and R signals at its output terminals 18 and 19.

The smoothing circuit 20 operates in a well-known manner to extract a DC voltage from the detected signal supplied from the AM detector circuit 13. The DC voltage from the smoothing circuit 20 varies with the input level to the antenna. More specifically, the DC voltage varies in proportion to the AM detected output level, thus presenting a characteristic represented by the curve 71 shown in FIG. 7C. The DC voltage is applied to the base of the transistor 321 of the differential amplifier 320 and acts as a control signal $V_c$ for controlling the current in the transistor 321 and finally controlling the input/output characteristic of the differential pair of transistors 311 and 312 in the differential amplifier 310.

Figure 7A:
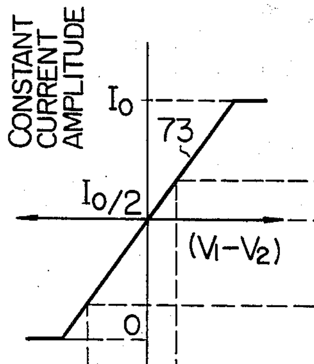
FIGS. 7A to 7C are representations showing the characteristics and operations of the circuit shown in FIG. 6.
Figure 7B:
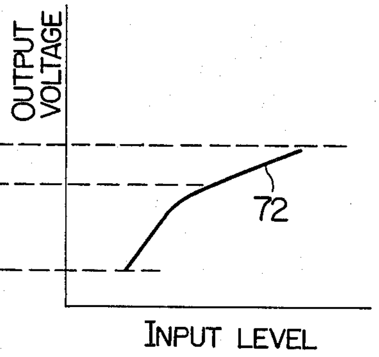
Figure 7C:
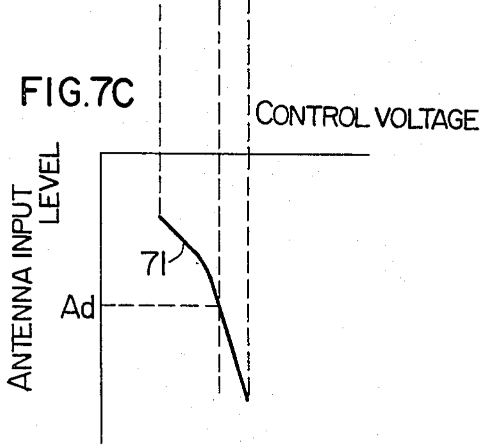

Next, the gain control operation of the separation compensating circuit 30 shown in FIG. 6 will be described with reference to FIG. 7. FIG. 7A shows an input/output characteristic of the differential amplifier 310, FIG. 7B shows an output characteristic, and FIG. 7C shows a control voltage characteristic. Assuming that the current from the regulated current source 330 is $I_O$ in FIG. 6, a current $I_O/2$ flows through each of the transistors 321 and 322 and a current $I_O/4$ flows through each of the transistors 311 and 312 when no signal input exists. The base voltage (difference operating voltage) of the transistor 322 of the differential amplifier 320 is adjusted by the variable operating voltage source 324 in order that the current flowing through the differential amplifier 320 varies linearly with the control voltage $V_c$ that is applied to the base of the transistor 321.

In the circuit arrangement of FIG. 6 adjusted as above, if the voltage of the control signal $V_c$ at the control terminal $T_c$ is varied from the adjusting voltage $V_1$ and the base voltages of the transistors 321 and 322 are related by $V_1>V_2$, the collector current of the transistor 321 increases with the control voltage and the collector currents of the transistors 311 and 312 also increase, thus increasing the output amplitude from the differential amplifier 310. In this situation, the current of the transistor 322 decreases by the increment in the current of the transistors 321. If $V_1<V_2$, on the other hand, the collector current of the transistor 321 decreases with the control voltage and the collector currents of the transistors 311 and 312 also decrease, thus decreasing the output amplitude. In this situation, the current of the transistor 322 increases by the decrement in the current of the transistor 321. For example, if the current flowing through the transistor 321 increases by $\Delta I_O$ to $I_O/2+\Delta I_O$, a current of $I_O/4+\Delta I_O/2$ flows through each of the transistors 311 and 312 and a current of $I_O/2-\Delta I_O$ flows through the transistor 322. As a result, the currents of the transistors 311 and 312 increase or decrease in a range from $I_O/4+\Delta I_O/2$ to $I_O/2$ or a range of $I_O/4+\Delta I_O/2$ to zero. Therefore, by varyning the $\Delta I_O$ with the control signal $V_c$, the amplitude level in the differential amplifier 310 can be varied, i.e., its output amplitude can be varied.

The amplitude from the differential amplifier 310 varies in proportion to the control signal $V_c$ as indicated by the curve 72 in FIG. 7B. The control signal $V_c$, which is proportional to the AM detected output level as described previously, controls the level of the stereophonic difference signal (L−R) to be equal to the level of the stereophonic sum signal (L+R) independent of the antenna input level. Of course, the regulated current $I_O$ for the differential amplifier 320 must be so determined that the stereophonic difference signal (L−R) may have the same level as that of the stereophonic sum signal (L+R).

In the manner described above, the three signals (L+R), (L−R) and −(L−R) supplied to the matrix circuit 17 can be compensated to have the same amplitude for any antenna input level. This compensates for the degradation of separation due to an amplitude level difference appearing at the output terminals 18 and 19 of the matrix circuit 17 and can maintain the degree of separation constant independent of the antenna input level. In other words, the control of the stereophonic difference signals ±(L−R) by the control voltage proportional to the stereophonic sum signal (L+R) alleviates the phenomenon that the separation of the R and L signals varies with the antenna input level.

Figure 8:
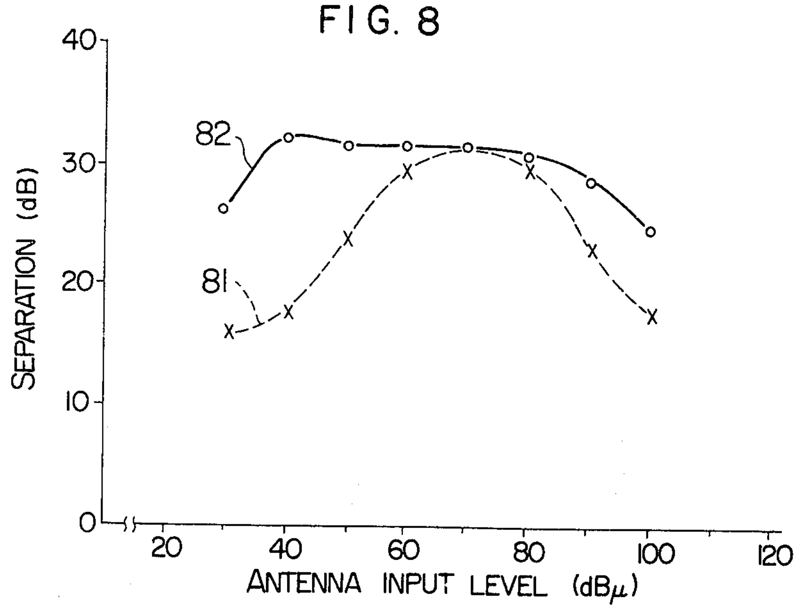
FIG. 8 is a representation of the characteristics showing an improvement by the present invention.

FIG. 8 shows how the above-described embodiment of the present invention can improve the degree of separation vs. antenna input level characteristic. In FIG. 8, the curve 81 represents the characteristic of a conventional circuit while the curve 82 represents the characteristic of a circuit compensated according to the present invention. In comparison of the two characteristics, the effect of the present invention is apparent, that is, the characteristic according to the present invention presents a flat response for the antenna input level, which is a substantial improvement. It should be noted that such problems as oscillation need not be taken into account in the system like the above-described embodiment in which the compensation control of separation is carried out in a detected signal (audio signal) stage.

Figure 9:
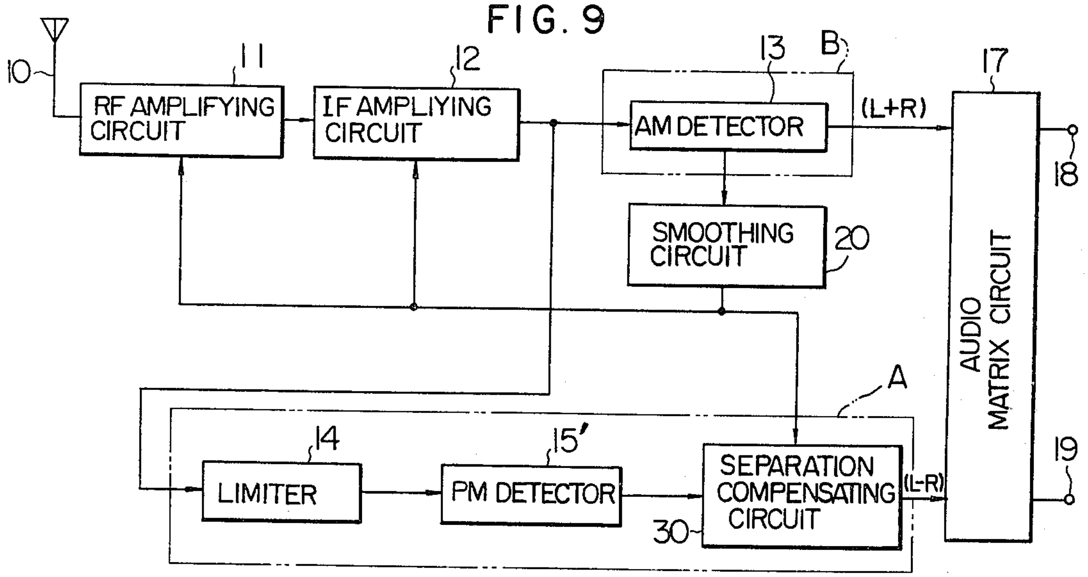
FIGS. 9 to 11 are block diagrams showing other embodiments of the present invention.

FIG. 9 shows another embodiment of the present invention in which a separation compensating circuit 30 and its associated control means are provided in a demodulator circuit of the AM/PM system, and this embodiment offers a similar effect to the previously described embodiment. The arrangement of FIG. 9 is different from that of FIG. 5 in that it has a PM detector circuit 15′ instead of the FM detector circuit 15 and eliminates the deemphasis circuit 16.

In the foregoing embodiments, the separation compensating circuit 30 is provided in the FM detector stage A of the AM stereophonic demodulator circuit of the AM/FM or AM/PM system, and the gain (amplitude) of the separation compensating circuit is controlled by a DC signal proportional to the antenna input level supplied from the AM detector stage B so that the stereophonic difference and sum signals (L−R) and (L+R) are controlled to have the same amplitude for any antenna input level. However, the present invention is not limited to these embodiments, and alternately, the gain of the limiter circuit 14 or the FM detector circuit 15 of the FM detector stage A may be controlled directly by a DC signal proportional to the antenna input level supplied from the AM detector stage B.

Figure 10:
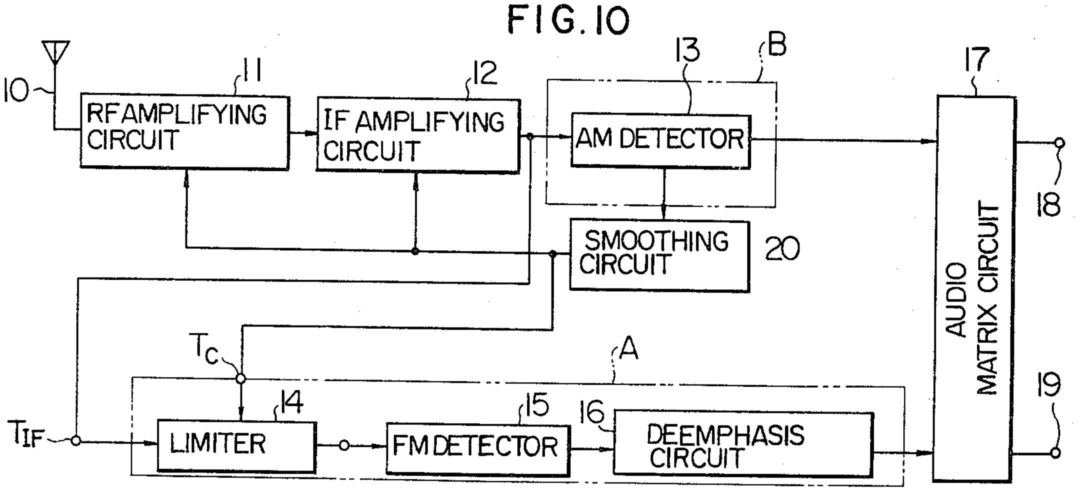
Figure 11:
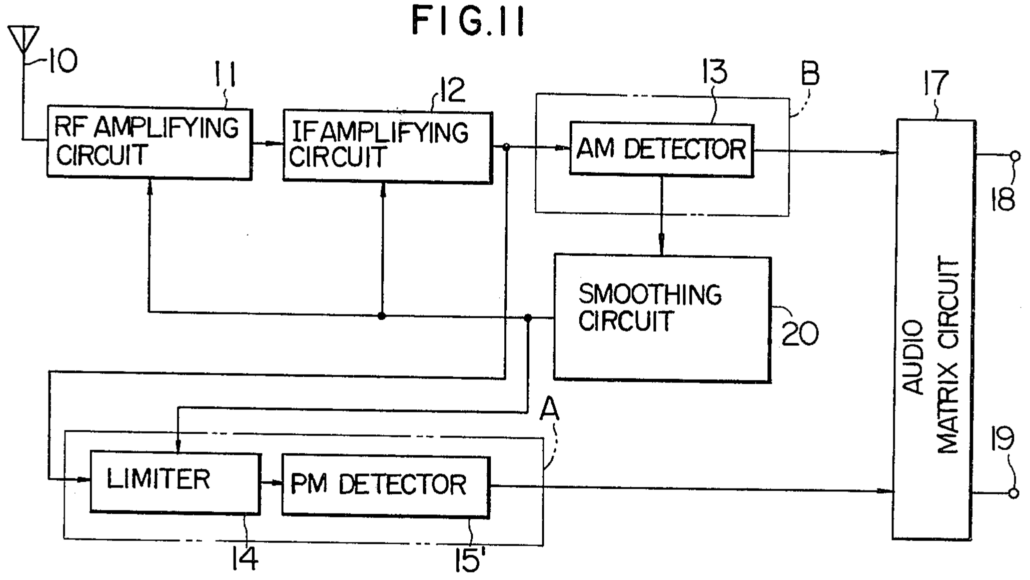
Figure 12:
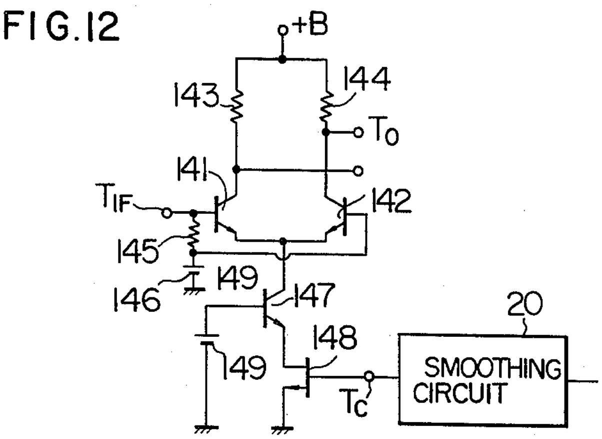
FIG. 12 is a diagram of a limiter circuit.

The above-mentioned alternative embodiment will now be described in conjunction with a particular circuit. FIGS. 10 and 11 show block diagrams of AM stereophonic demodulator circuits for the AM/FM and AM/PM systems, and FIG. 12 shows a specific example of a limiter circuit 14 for these AM stereophonic demodulator circuits. In these figures, the same members as in FIGS. 5 and 9 are designated by the same reference numerals as in FIGS. 5 and 9, and the description of such members is omitted here. In FIG. 12, reference numerals 141 and 142 designate a differential pair of transistors. The emitters of the transistors 141 and 142 are commonly connected with each other, and the collectors of these transistors connected to a power source +B through load resistors 143 and 144, respectively. The base of the transistor 141 is connected directly to an output terminal $I_{IF}$ of an IF amplifying circuit 12, and also connected through a resistor 145 to an operating voltage source 146. The base of the transistor 142 is connected to the operating voltage source 146. Reference numeral 147 designates a transistor for supplying current to the transistors 141 and 142. The transistor 147 has its collector connected to the emitters of the transistors 141 and 142, its emitter connected to the drain of an field-effect transistor 148, and its base connected to an operating voltage source 149. The source electrode of the transistor 148 is grounded and its gate is connected to an output terminal $T_c$ of the smoothing circuit 20.

The gain and the output amplitude of the differential pair of transistors 141 and 142 in the above-described limiter circuit 14 depend upon the regulated current for the limiter circuit.

In order to vary this regulated current, the field-effect transistor 148 connected to the emitter of the transistor 147 may be operated in a variable resistance region. Since the output voltage from the smoothing circuit 20 which produces a rectified output voltage proportional to the antenna input level is applied to the gate of the transistor 148, the resistance value between the drain and source electrodes of the transistor 148, i.e., the emitter resistance of the transistor 147 can be variable. Because the base of the transistor 147 is at a constant voltage, the variation in the emitter resistance causes the current flowing therethrough to be varied, thereby controlling the gain and the amplitude of the differential amplifier (141, 142) forming in part the limiter circuit 14.

Figure 13:
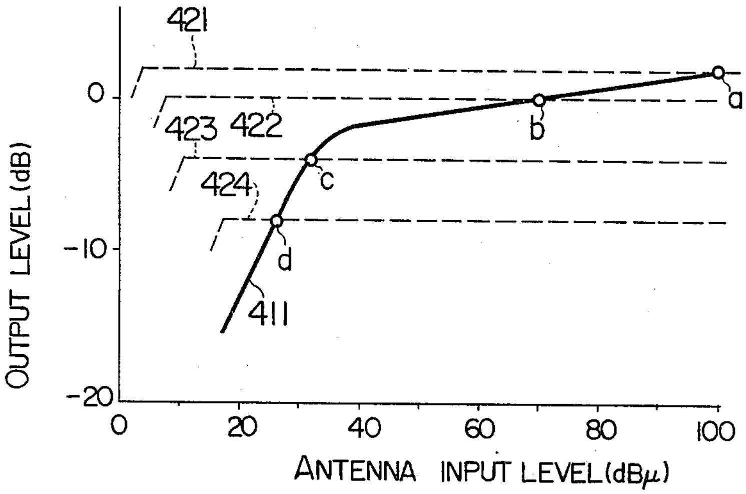
FIG. 13 is a representation of the characteristics for explaining the present invention.

FIG. 13 is a characteristic representation showing the above-described control operation. In FIG. 13, the abscissa represents the antenna input level, and the ordinate represents the detected output level. It is well known that the input/output characteristic in the FM detection and PM detection rises linearly when the input level is relatively low. Above a particular input level (at which an amplitude limiter operates), however, the detected output level becomes constant and has characteristics as indicated by curves 421, 422, 423 and 424. The difference between these characteristics is described below. As described previously, the limiter level of the differential amplifier in the amplitude limiter circuit 14 is determined by the regulated current flowing through the differential amplifier. That is, as the regulated current increases, the output amplitude increases, and the limiter starts to operate at a lower input level. The output level increases with the amplitude. This operation will be described hereinafter also with reference to FIG. 10.

At a high input level, e.g., at 100 dBμ, the output voltage of the AM detector circuit 13 is great and thus the DC output voltage of the smoothing circuit 20 is great. This DC output voltage is applied to the control terminal $T_c$ of the amplitude limiter circuit 14 so as to decrease the resistance value between the drain and source electrodes of the field-effect transistor 148, and accordingly the emitter resistance of the transistor 148 to determine the regulated current decreases to boost the regulated current. In this manner, the gain and the amplitude of the amplitude limiter 14 is increased, and the characteristics indicated by the curves 421, 422, 423 and 424 are obtained. Similarly, as the input level decreases to 70 dBμ, 30 dBμ and 23 dBμ, the DC output voltage from the smoothing circuit 20 decreases proportionally. Accordingly, the regulated current of the amplitude limiter circuit 14 decreases, and the gain and the amplitude thereof also decrease. Thus, the detected output decreases.

The input/output characteristic curves 421 to 424 are curves obtained in the case where the amplitude limiter circuit 14 has a gain adapted for the regulated current for an input level which is assumed to be constant. Actually, however, the input level is variable and the regulated current and gain can vary. Therefore, the actual output level at a 100 dBμ input level corresponds to a point a for 100 dBμ on the curve 421, and the actual output level at a 70 dBμ input level corresponds to a point b for 70 dBμ on the curve 422. Similarly, the actual output levels at a 30 dBμ input level and at a 23 dBμ input level correspond to points c and d, respectively. A solid line passing through these points represents an actual input/output characteristic of the FM detector circuit 15 and the PM detector circuit 15' which have been controlled by the output voltage from the AM detector circuit 13.

By using the foregoing control method, the regulated current for the amplitude limiter circuit 14 is adjusted so that the AM detected output level, and the FM or PM detected output level, are equal at a reference input level, e.g., at 70 dBμ. That is, the output voltage from the smoothing circuit 20, which is applied to the gate of the field-effect transistor 148 to determine the regulated current, is adjusted to that effect.

This adjustment can allow the FM detected output level or the PM detected output level to vary in proportion to the AM detected output level. Consequently, the AM detected output or stereophonic sum signal (L+R), and the FM (or PM) detected output or stereophonic difference signal (L−R), have substantially the same level even if the input level were variable. This alleviates the degradation of separation due to variations in the input level, which has been involved in the prior art circuit as described previously.

Figure 14:
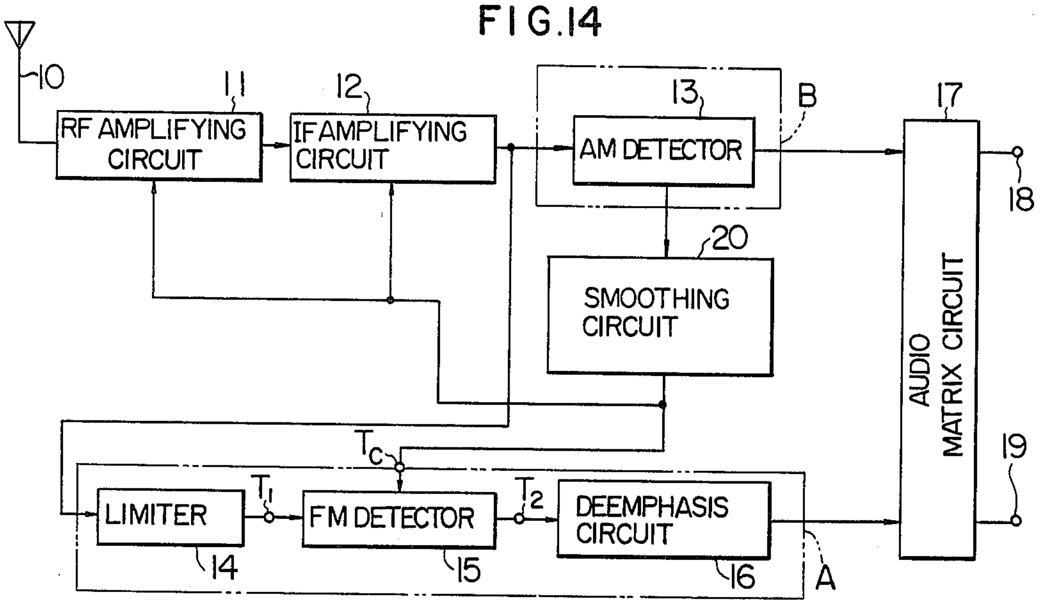
FIGS. 14 and 15 are block diagrams of still other embodiments of the present invention.
Figure 16:
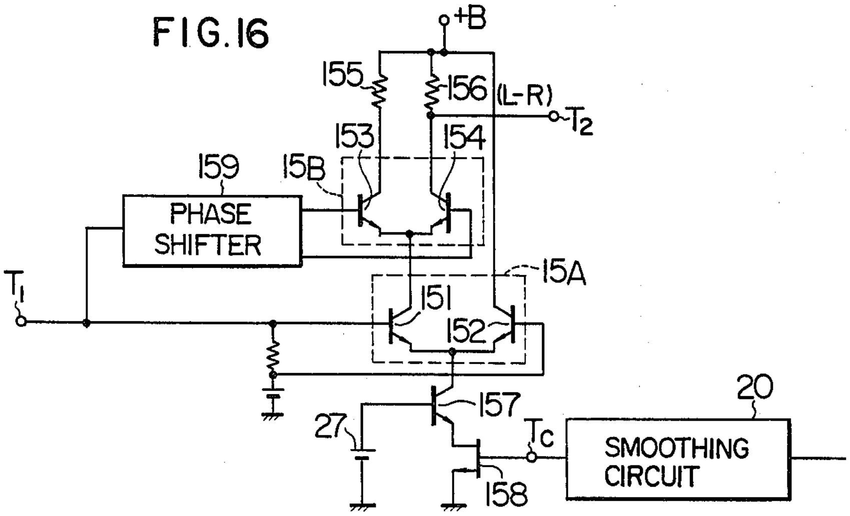
FIG. 16 is a circuit diagram of a quadrature detector.
Figure 15:
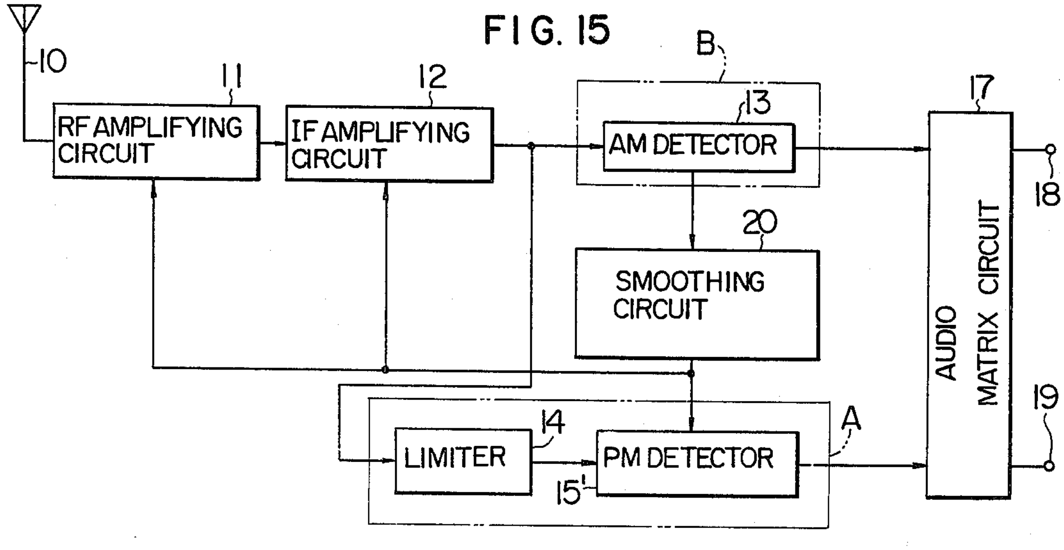

FIGS. 14 and 15 show embodiments wherein the FM detector circuit comprises a quadrature detector as shown in FIG. 16 whose gain and amplitude are controlled.

FIG. 16 is a circuit diagram of the quadrature detector. In FIG. 16, a differential pair of transistors 151 and 152 constitute a first switching circuit 15A. The collector of the transistor 151 is connected to the commonly connected emitters of a differential pair of transistors 153 and 154 which constitute a second switching circuit 15B. The collectors of the transistors 153 and 154 are connected through their respective load resistors 155 and 156 to a power source +B. The collector of the transistor 152 is connected to the power source +B. The commonly connected emitters of the differential pair of transistors 151 and 152 are connected to the collector of a transistor 157. The base of the transistor 157 is connected to an operating voltage source, and the emitter of the transistor 157 is connected to the drain electrode of a field-effect transistor 158. The field-effect transistor 158 has a grounded source electrode and a gate electrode connected to the output of the smoothing circuit 20. An input terminal $T_1$ receives a frequency-modulated or phase-modulated input signal which is supplied to the first switching circuit 15A. The input signal at the input terminal $T_1$ is also supplied to a phase shifter 159 which, in turn, shifts the phase of the signal by 90° and supplies the signal to the second switching circuit 15B. A multiplier circuit constituted by the first and second switching circuits 15A and 15B performs FM detection or PM detection in a well-known manner. The quadrature detector will not be described in further detail herein because it is well known and described, for example, in U.S. Pat. No. 4,122,394 (issued to Isao Fukushima, Isao Akitake and Yoshimi Iso on Oct. 24, 1978).

In the above-described circuit arrangement, the field-effect transistor 158, which is connected to the emitter of the transistor 157 to determine the gain and output amplitude of the detector circuit 15 and the regulated current, is operated in a variable resistance region. The gate electrode of the field-effect transistor 158 is connected to the output of the smoothing circuit 20, and the resistance value between its drain and source electrodes varies with the input level. Therefore, the currents flowing through the first and second switching circuits 15A and 15B are variable, so that the gain and output amplitude of the detector circuit is controlled in accordance with the input level. In this manner, the degradation of separation is eliminated as indicated by the characteristic shown in FIG. 13.

According to the present invention, as described by way of the foregoing embodiments, the gain (amplitude) of the FM or PM detector circuit is controlled by the antenna input level so that the stereophonic sum signal (L+R) derived from AM detection and the stereophonic difference signal (L−R) derived from FM or PM detection have no difference in their levels. This prevents the degradation of separation.

In the foregoing embodiments, the control signal is extracted from the AM detector circuit, but it may be extracted from any other circuit portions which provide the control signal proportional to the antenna input level. For example, the control signal may be obtained by rectifying and smoothing a signal from the output stage of either the IF amplifying circuit 12 or the AM detector circuit 13.

Figure 17:
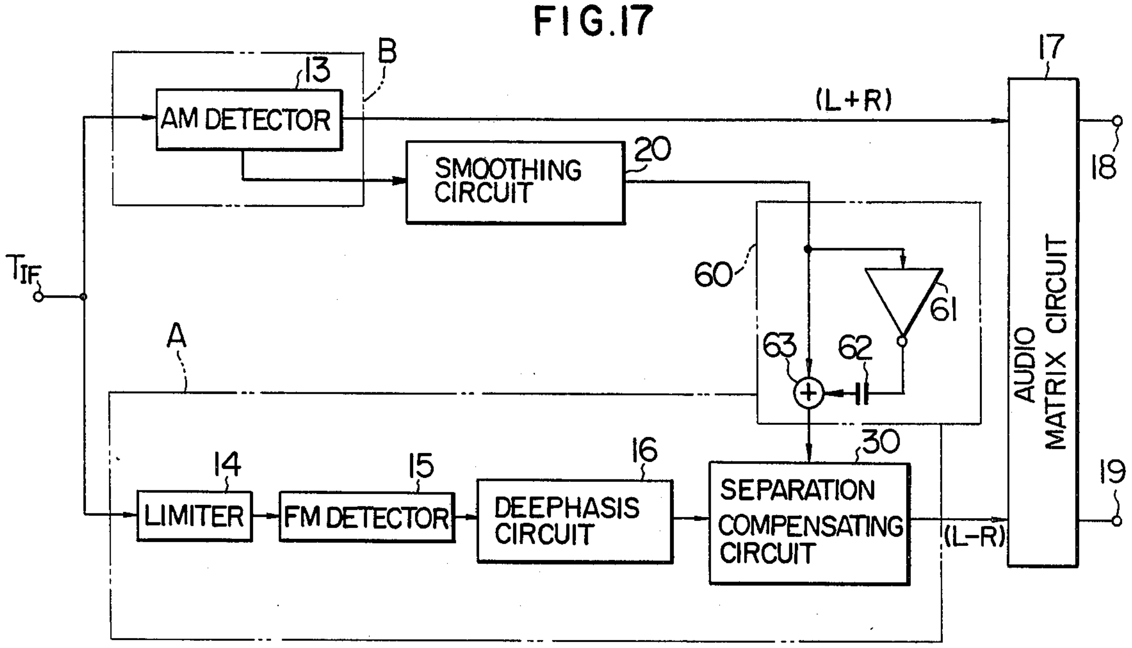
FIG. 17 is a block diagram showing another embodiment of the present invention.
Figure 19:
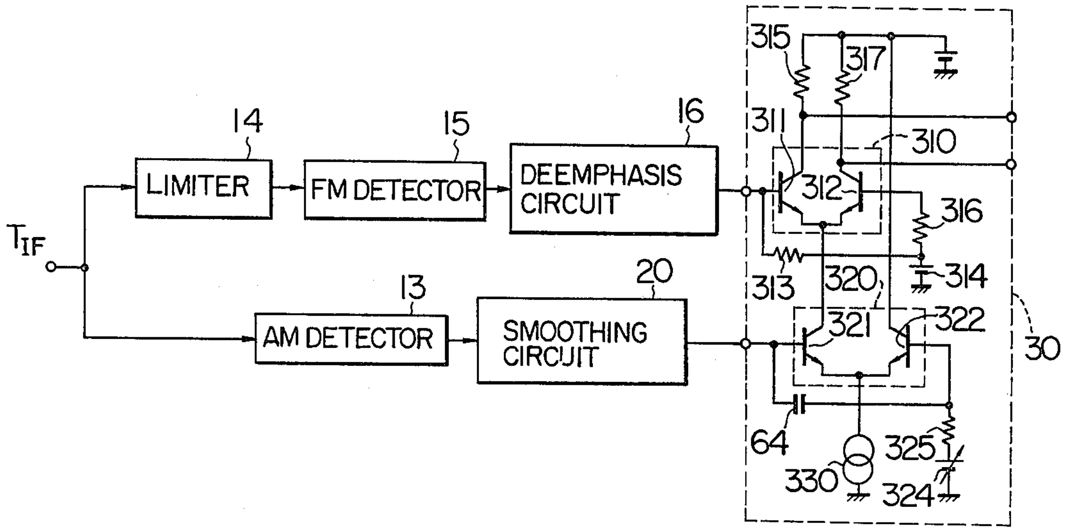
FIG. 19 is a circuit diagram showing still another embodiment of the present invention.

FIGS. 17 and 19 are block diagrams showing other embodiments of the present invention, which are suitable for use in mobile radio receivers. In a mobile radio receiver as in a car, the antenna input level changes frequently. In order to respond to such frequent changes, the smoothing circuit 20 must have a smaller time constant. In that case, the smoothing circuit is not capable of fully smoothing the low-frequency signal from the AM detector output at low modulating frequencies. As a result, the low-frequency modulating signals affect the regulted current source 330 to fluctuate the regulated current, and the low-frequency modulating signals appear at the output of the differential amplifier 310 consisting of the transistors 311 and 312. That is, the differential amplifier 310 provides at its output stage an undesirable component of the stereophonic sum signal (L+R) in addition to the proper stereophonic difference signal (L−R). Then, if this stereophonic sum signal component is introduced into the matrix circuit 17, the degree of separation between the L and R signals separated by the matrix circuit decreases as the modulating frequency becomes low.

This disadvantage may be alleviated by the arrangements shown in FIGS. 17 and 19 in which the time constant of the smoothing circuit 20 need not be increased. In FIG. 17, an inverter 61 produces a signal having a phase opposite to that of the low-frequency modulating signal from the smoothing circuit 20, and the signal of the opposite phase is added to the signal from the smoothing circuit by an adder 63 in order to cancel the modulating signal carried on the DC voltage. In FIG. 19, there is provided a regulated current source of a differential arrangement in which a differential amplifier is utilized for in-phase rejection.

These arrangements will be described more specifically with reference to the drawings. FIG. 17 is a block diagram of an AM/FM demodulator circuit. In FIG. 17, the same members as in FIG. 5 are designated by the same reference numerals as in FIG. 5, and their definitions are omitted herein. Reference numeral 60 designates a low-frequency modulating signal compensating circuit connected between the smoothing circuit 20 and the separation compensating circuit 30. The compensating circuit 60 comprises an inverter 61 for inverting the phase of the low-frequency modulating signal appearing at the output of the smoothing circuit 20, a capacitor 62, and an adder 63 for adding the low-frequency modulating signal from the smoothing circuit 20 to the inverted low-frequency modulating signal from the inverter 61. In this arrangement, the modulating frequency component carried on the DC output voltage from the smoothing circuit 20 is canceled by the inverted modulating frequency component from the inverter 61 at the control terminal of the differential amplifier 30, and thus the degradation of separation due to low-frequency modulating frequencies may be compensated.

Figure 18:
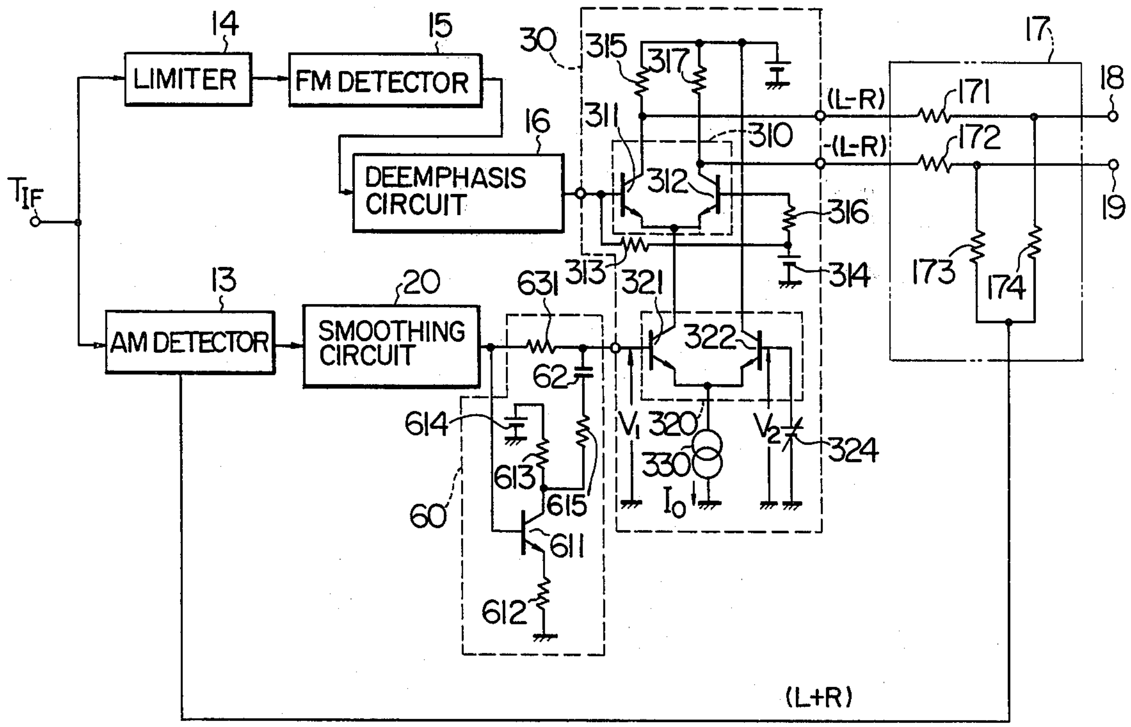
FIG. 18 is a specific circuit diagram showing the major part of the embodiment shown in FIG. 17.

FIG. 18 shows a specific example of the above-described circuit arrangement. In FIG. 18, the output of the smoothing circuit 20 is connected to the base of a transistor 611 forming in part the inverter 61. The transistor 611 has its emitter grounded through a resistor 612, and its collector connected through a resistor 613 to a power source 614. The respective values of the resistors 612 and 613 are selected in such a manner that the inverter 61 has a gain of unity. Since the base and collector of the transistor are opposite in phase with each other as is well known, the AC component (at modulating frequency) is canceled when the collector output obtained through the resistor 615 and the capacitor 62 are added in AC manner to the output from the smoothing circuit 20 obtained through the resistor 631.

In the embodiment shown in FIG. 19, a capacitor 64 of a low impedance is provided between the bases of transistors 321 and 322 in the separation compensating circuit 30, the function of removing in-phase components by the differential amplifier 320 is utilized to prevent the modulating frequency carried on the control voltage from being sensed. The circuit arrangement and operation of the separation compensating circuit 30 are the same as in the embodiment of FIG. 18.

Figure 20:
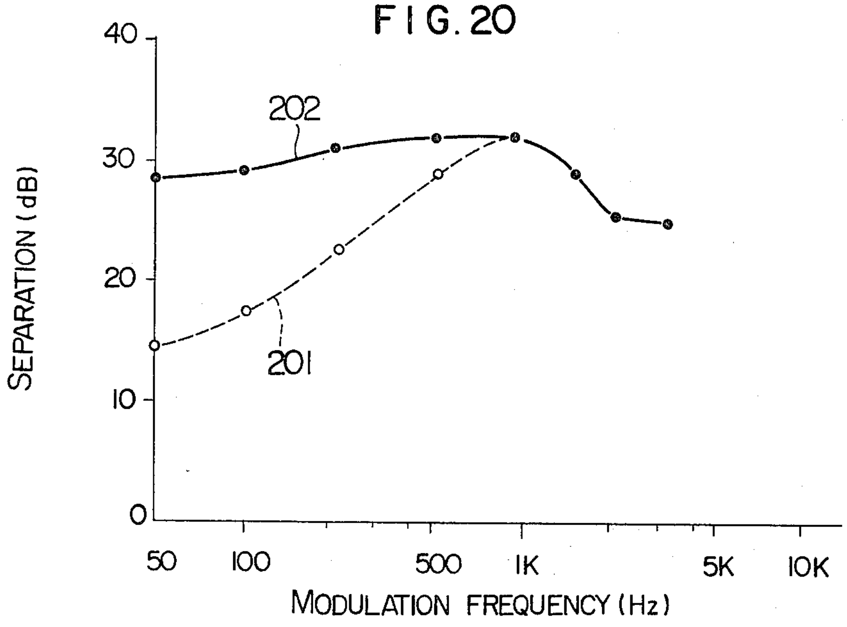
FIG. 20 is a representation of the characteristics for explaining the present invention.

FIG. 20 is a characteristic diagram showing actual data of the separation vs. modulating frequency in the embodiments shown in FIGS. 6 and 18. In FIG. 20, the curve 201 represents the separation charactersitic of the embodiment shown in FIG. 6, and this curve drops sharply in a range lower than 1 KHz because the time constant of the smoothing circuit 20 is limited in this case. The curve 202 represents the separation characteristic of the embodiment shown in FIG. 18, and in this case the separation characteristic is flat in a relatively wide range of frequencies, indicating a satisfactory improvement.

As described above, according to the embodiments shown in FIG. 17 and 19, the stereophonic sum and difference signals are compensated to have the same amplitude for any antenna input level, and the problem of the degradation of separation at the output terminals 18 and 19 of the matrix circuit 17, which depends on the antenna input level as well as modulating frequency, can be substantially solved by the compensating circuit for canceling the modulating signal carried on the control voltage.

Although in the above description it is assumed that the stereophonic sum and difference signals (L+R) and (L−R) are obtained from the AM detector circuit and the FM or PM detector circuit, respectively, this relation between signals and their sources may be in reverse in some transmission systems. As will be readily apparent to those skilled in the art, the present invention is also applicable to an AM/FM or AM/PM transmitting and receiving system wherein two stereophonic information signals separable into L and R channel signals are employed, as well as to a system wherein stereophonic sum and difference signals are used as stereophonic signals. In brief, the present invention may be applied to any demodulator circuit which includes two detector means of different signal gains for differently modulated signals.

We claim:

1. An AM stereophonic demodulator circuit for use in an amplitude/angle modulation system, comprising first detector means for producing a stereophonic sum signal (L+R) from a received stereophonic signal; a second detector means for producing a stereophonic difference signal (L−R) from the received stereophonic signal, said second detector means including a separation compensating circuit; a demodulating matrix circuit connected to said first and second detector means for separating L and R channel signals from the stereophonic sum and difference signals; and control means connected to said first and second detector means for extracting a DC signal proportional to an antenna input signal level from said first detector means and supplying the DC signal to said separation compensating circuit of said second detector means, said control means being adapted to control the gain and amplitude of said separation compensating circuit of said second detector means in accordance with the DC signal, whereby the stereophonic sum and difference signals are controlled to have the same amplitude for the antenna input signal level, wherein said control means includes a smoothing circuit connected to said first detector means for extracting a DC signal from said first detector means, an inverter connected to said smoothing circuit for producing a signal of the opposite phase to that of the DC signal in response to a low-frequency modulating signal appearing at an output of said smoothing circuit, and an adder connected to said smoothing circuit, said inverter and said second detector means for adding the output signal of said inverter to the output signal of said smoothing circuit so as to cancel the low-frequency modulating signal contained in the output signal of said smoothing circuit and thereafter supplying the DC signal from said smoothing circuit to said second detector means.

2. An AM stereophonic demodulator circuit for use in an amplitude/angle modulation system, comprising an AM detector circuit for producing a stereophonic sum signal (L+R) from a received stereophonic signal; angle modulation detector means for producing a stereophonic difference signal (L−R) from the received stereophonic signal, said angle modulation detector means including a limiter circuit for removing AM components of the stereophonic signal, an angle modulation detector circuit for producing the stereophonic difference signal (L−R) from the stereophonic signal having passed through said limiter circuit, and a differential amplifier circuit for amplifying the stereophonic difference signal detected by said angle modulation detector circuit, said differential amplifier circuit including a regulated current source, a first differential amplifier having a differential pair of transistors, one of which serves as a current source transistor, and a second differential amplifier having another differential pair of transistors to amplify the stereophonic difference signal; a demodulating matrix circuit connected to said AM detector circuit and said differential amplifier of said angle modulation detector means for separating L and R channel signals from the stereophonic sum and difference signals (L+R) and (L−R); and control means connected to said AM detector circuit and said first differential amplifier for extracting a DC signal proportional to an antenna input signal level from said AM detector circuit and supplying the DC signal to said first differential amplifier, said control means being adapted to control the gain and amplitude of said differential amplifier circuit in accordance with the DC signal, whereby the stereophonic sum and difference signals are controlled to have the same amplitude for the antenna input signal level.

3. An AM stereophonic demodulator circuit according to claim 1, wherein said separation compensating circuit includes a differential amplifier circuit, and said control means controls the gain and amplitude of said differential amplifier circuit, said differential amplifier circuit including a regulated current source, a first differential amplifier including a differential pair of transistors one of which serves as a current source transistor, a second differential amplifier including another differential pair of transistors to amplify the stereophonic difference signal, and an operating voltage adjuster means connected to said first differential amplifier, said operating voltage adjuster means being adapted to establish an adjusting point where the current flowing through said differential amplifier varies linearly with the antenna input level, and wherein said control means controls the current flowing through said first differential amplifier in said differential amplifier circuit.

4. An AM stereophonic demodulator circuit according to claim 1, wherein said separation compensating circuit includes a differential amplifier circuit, and said control means controls the gain and amplitude of said differential amplifier circuit, said differential amplifier circuit includes a regulated current source, a first differential amplifier including a differential pair of transistors one of which serves as a current source transistor, a second differential amplifier including another differential pair of transistors to amplify the stereophonic difference signal, and a capacitor of a low impedance provided between the bases of the differential pair of transistors in said first differential amplifier.

5. An AM stereophonic demodulator circuit according to claim 2, wherein said first differential amplifier further includes a capacitor of a low impedance provided between the bases of the differential pair of transistors in the first differential amplifier.

6. An AM stereophonic demodulator circuit according to claim 2, wherein said differential amplifier includes an operating voltage adjuster means connected to said first differential amplifier.

* * * * *